(12) United States Patent
Lee et al.

(10) Patent No.: US 9,105,496 B2
(45) Date of Patent: Aug. 11, 2015

(54) COMPLEMENTARY METAL OXIDE SEMICONDUCTOR DEVICE, OPTICAL APPARATUS INCLUDING THE SAME, AND METHOD OF MANUFACTURING THE SAME

(71) Applicant: Samsung Electronics Co., Ltd., Suwon-Si, Gyeonggi-Do (KR)

(72) Inventors: Sang-moon Lee, Yongin-si (KR); Young-jin Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/974,233

(22) Filed: Aug. 23, 2013

(65) Prior Publication Data

US 2014/0191252 A1    Jul. 10, 2014

(30) Foreign Application Priority Data

Jan. 7, 2013    (KR) .................. 10-2013-0001789

(51) Int. Cl.
| | | |
|---|---|---|
| H01L 27/092 | (2006.01) | |
| H01L 29/267 | (2006.01) | |
| H01L 27/15 | (2006.01) | |
| H01L 21/8258 | (2006.01) | |
| H01L 27/06 | (2006.01) | |

(52) U.S. Cl.
CPC .......... *H01L 27/092* (2013.01); *H01L 21/8258* (2013.01); *H01L 27/0605* (2013.01); *H01L 27/15* (2013.01); *H01L 29/267* (2013.01)

(58) Field of Classification Search
USPC .......................................................... 257/616
See application file for complete search history.

(56) References Cited

U.S. PATENT DOCUMENTS

| | | | |
|---|---|---|---|
| 7,268,377 B2 * | 9/2007 | Ieong et al. ................... 257/255 |
| 2002/0024094 A1 * | 2/2002 | Gao et al. ...................... 257/347 |
| 2007/0181977 A1 | 8/2007 | Lochtefeld et al. | |
| 2007/0252216 A1 * | 11/2007 | Muhammad .................. 257/369 |

FOREIGN PATENT DOCUMENTS

| | | |
|---|---|---|
| KR | 10-0523492 B1 | 12/2005 |
| KR | 2012-0089764 A | 8/2012 |

* cited by examiner

*Primary Examiner* — Stephen W Smoot
(74) *Attorney, Agent, or Firm* — Harness, Dickey & Pierce, P.L.C.

(57) ABSTRACT

A complementary metal oxide semiconductor (CMOS) device includes an n-type first transistor on a silicon substrate, the n-type first transistor including a Group III-V compound semiconductor substrate, and a p-type second transistor on the silicon substrate, the p-type second transistor including a germanium based substrate.

10 Claims, 11 Drawing Sheets

COMPLEMENTARY METAL OXIDE SEMICONDUCTOR DEVICE, OPTICAL APPARATUS INCLUDING THE SAME, AND METHOD OF MANUFACTURING THE SAME

CROSS-REFERENCE TO RELATED APPLICATIONS

This application claims priority of Korean Patent Application No. 10-2013-0001789, filed on Jan. 7, 2013, in the Korean Intellectual Property Office, the disclosure of which is incorporated herein in its entirety by reference.

BACKGROUND

1. Field

Example embodiments relate to semiconductor devices and optical devices including the same, and more particularly, to complementary metal oxide semiconductor (CMOS) devices, optical apparatuses including the same, and methods of manufacturing the same.

2. Description of the Related Art

Research into device developments using compound semiconductors has been actively conducted. In particular, research into replacing silicon semiconductor materials using Group III-V compound semiconductors and germanium (Ge) has been actively conducted.

Research into manufacturing a relatively high performance CMOS has been conducted by using Group III-V materials having higher electron mobility than silicon and semiconductor materials having higher hole mobility than silicon.

If Group III-V materials or Ge is integrated on a large-area silicon substrate, general silicon manufacturing processes may be used, which may lower costs.

However, due to a large lattice constant difference and thermal expansion rate between a Group III-V material and silicon or Ge and silicon, many defects occur at the interface between these materials. Due to such defects, there are limitations in applying a Group III-V material and Ge to a device.

SUMMARY

Example embodiments provide higher performance complementary metal oxide semiconductor (CMOS) devices manufactured by simultaneously forming a Group III-V material and a germanium (Ge) base material on a silicon substrate. Example embodiments also provide optical apparatuses including a CMOS device and an optical device. Example embodiments also provide methods of manufacturing a CMOS device.

Additional aspects will be set forth in part in the description which follows and, in part, will be apparent from the description, or may be learned by practice of example embodiments.

According to example embodiments, a complementary metal oxide semiconductor (CMOS) device may include a n-type first transistor on a silicon substrate, the n-type first transistor including a first substrate, the first substrate including a Group III-V compound semiconductor, and a p-type second transistor on the silicon substrate, the p-type second transistor including a second substrate, the second substrate including germanium.

The n-type first transistor may include a channel layer on the first substrate, a source electrode on the channel layer, a drain electrode on the channel layer and spaced apart from the source electrode, and a gate stacked structure on the channel layer between the source electrode and the drain electrode.

The p-type second transistor may include a first impurity area in the second substrate, a second impurity area in the second substrate and spaced apart from the first impurity area, and a gate stacked structure on the second substrate between the first impurity area and the second impurity area.

The first substrate may be one of a binary compound semiconductor substrate and a multicomponent compound semiconductor substrate including at least one of arsenic (As), phosphorus (P), and antimony (Sb). The second substrate may be one of a germanium (Ge) substrate and a silicon-germanium (SiGe) substrate. One of the first and second substrates may be surrounded by the other one of the first and second substrates.

According to example embodiments, an optical apparatus may include a CMOS device on a silicon substrate, the CMOS device including a n-type first transistor including a first substrate, the first substrate including a Group III-V compound semiconductor, and a p-type second transistor including a second substrate, the second substrate including germanium, and an optical device on the silicon substrate separate from the CMOS device.

The optical device may be one of a light emitting diode (LED) and a laser diode (LD), and may include a Group III-V compound semiconductor. The optical device may be a light receiving device, and may include a germanium (Ge) based semiconductor layer. One of the first and second substrates may be surrounded by the other one of the first and second substrates.

According to example embodiments, a method of manufacturing a CMOS device may include forming a first substrate on a silicon substrate, exposing a portion of the silicon substrate by removing a portion of the first substrate, forming a second substrate on the exposed portion of the silicon substrate, the second substrate insulated from the first substrate, forming a first transistor on one of the first and second substrates, and forming a second transistor on the other one of the first and second substrates, wherein one of the first and second substrates is a Group III-V compound semiconductor substrate, and the other one of the first and second substrates is a germanium based substrate.

The second substrate may be formed by forming an insulating layer to cover a surface of the first substrate and the exposed portion of the silicon substrate, removing the insulating layer from the exposed portion of the silicon substrate, and forming the second substrate on the exposed portion of the silicon substrate after the removing the insulating layer.

The first transistor may be formed by forming a channel layer on one of the first and second substrates, forming a source electrode and a drain electrode on the channel layer, the source electrode and the drain electrode spaced apart from each other, and forming a gate stacked structure on the channel layer between the source electrode and the drain electrode.

The second transistor may be formed by forming a gate stacked structure on one of the first and second substrates, and forming an impurity area in the one of the first and second substrates on both sides of the gate stacked structure.

The second substrate may be formed by forming the second substrate on the first substrate, and planarizing the second substrate to have a same height as the first substrate. The first substrate may be formed of one of a binary compound semiconductor substrate and a multicomponent compound semiconductor substrate including at least one of As, P, and Sb. The second substrate may be formed of one of a germanium (Ge) substrate and a silicon-germanium (SiGe) substrate.

A base of the second substrate may be formed to be lower or higher than a base of the first substrate. The second substrate may be formed to be lower than the base of the first substrate by removing a portion of the silicon substrate from the exposed portion of the silicon substrate. The second substrate may be formed to be higher than the base of the first substrate by increasing a thickness of the silicon substrate in the exposed portion of the silicon substrate.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
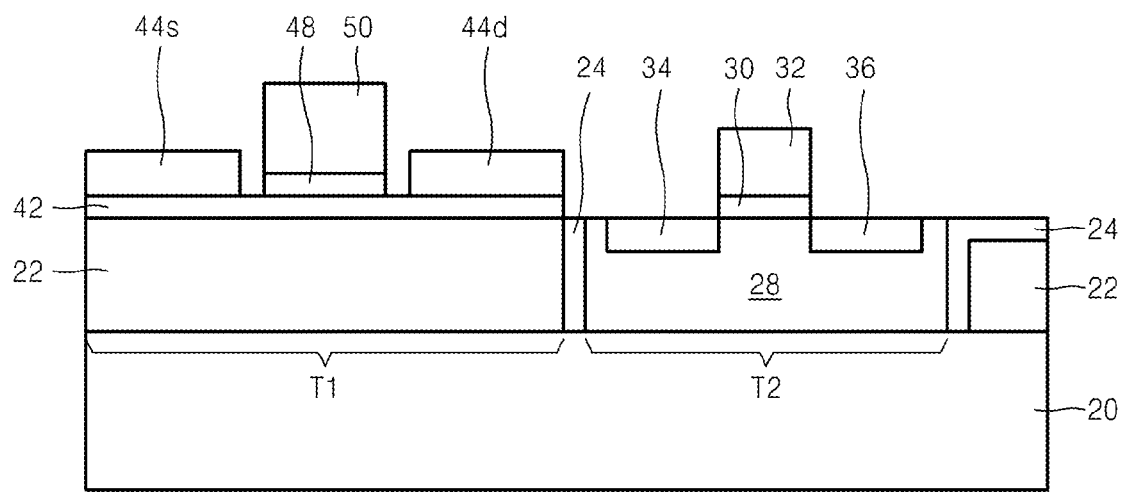
FIG. 1 is a cross-sectional view of a complementary metal oxide semiconductor (CMOS) device according to example embodiments.

Hereinafter, a complementary metal oxide semiconductor (CMOS) device, an optical apparatus including the same, and a method of manufacturing the same according to example embodiments will be described in detail with reference to the accompanying drawings. In the drawings, the thicknesses of layers and regions are exaggerated for clarity.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

First, a CMOS device according to example embodiments will be described. Referring to FIG. 1, a first CMOS device according to example embodiments may include a first transistor T1 and a second transistor T2. The first and second transistors T1 and T2 may be formed on a silicon (Si) substrate 20. The first transistor T1 may be an n-type transistor, for example, an n-MOS field effect transistor (FET). The second transistor T2 may be a p-type transistor, for example, a p-MOS FET. The second transistor T2 may be formed on the silicon substrate 20 around the first transistor T1. An insulating layer 24 may be provided on the silicon substrate 10 between the first transistor T1 and the second transistor T2. The insulating layer 24 may be a silicon oxide ($SiO_2$) layer, a silicon nitride ($SiN_x$) layer, or a silicon oxide nitride ($SiO_xN_y$) layer.

The first transistor T1 may include a first substrate 22 on the silicon substrate 20, a channel layer 42 on the first substrate 22, first and second electrodes 44s and 44d on the channel layer 42, a gate insulating layer 48 on the channel layer 42 between the first and second electrodes 44s and 44d, and a gate electrode 50 on the gate insulating layer 48. The first substrate 22 may be a compound semiconductor substrate including a Group III-V material.

The compound semiconductor substrate may be a binary, ternary, or quaternary compound semiconductor substrate. The compound semiconductor substrate including a Group III-V material may be a multicomponent compound semiconductor substrate including at least one of arsenic (As), phosphorus (P), and stibium (Sb). The binary compound semiconductor substrate may be a GaAs substrate, an InP substrate, an InSb substrate, or a GaSb substrate. The ternary compound semiconductor substrate may be an InGaAs substrate or an InGaSb substrate. The quaternary compound semiconductor substrate may be an InGaAsP substrate.

The first substrate 22 may have defects, but the first substrate 22 herein is formed to be thick enough to prevent or reduce the defects on the top layer thereof. For example, the first substrate 22 may have a thickness of about 1.0 μm to about 1.5 μm. Accordingly, the defects may exist only on the bottom layer of the first substrate 22. One of the first and second electrodes 44s and 44d may be a source electrode and the other one of the first and second electrodes 44s and 44d may be a drain electrode. The first and second electrodes 44s and 44d may be spaced apart from the gate electrode 50. The gate insulating layer 48 may be an oxide layer or a nitride layer.

The first substrate 22 may exist on both sides of the second transistor T2. The second transistor T2 may include first and second impurity areas 34 and 36 in a second substrate 28 on the silicon substrate 20. The second substrate 28 may be a germanium substrate or a compound semiconductor substrate including germanium. The compound semiconductor substrate including germanium may be a SiGe substrate.

The first and second impurity areas 34 and 36 are spaced apart from each other. One of the first and second impurity areas 34 and 36 may be an area doped with a p-type conductive impurity. One of the first and second impurity areas 34 and 36 may be a source area and the other one may be a drain area. A gate insulating layer 30 may be provided on the second substrate 28 between the first and second impurity areas 34 and 36. A gate electrode 32 may be formed on the gate insulating layer 30. As shown in FIG. 1, with a CMOS that simultaneously includes a Group III-V n-MOSFET having higher electron mobility than silicon and a Ge based p-MOSFET having higher hole mobility than silicon, device performance may be maximized or increased.

Figure 2:
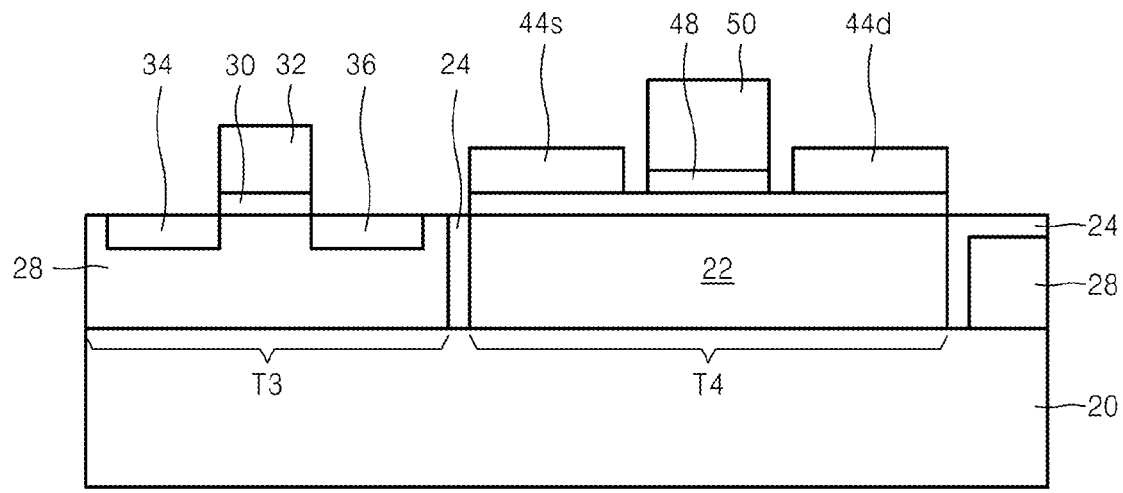
FIG. 2 is a cross-sectional view of a CMOS device according to example embodiments.

FIG. 2 is a view of a CMOS device according to example embodiments. Referring to FIG. 2, third and fourth transistors T3 and T4 may be formed on the silicon substrate 20. The fourth transistor T4 may be formed on the first substrate 20 around the third transistor T3. The third transistor T3 may be a p-MOSFET, and may be disposed at the position of the first transistor T1 of FIG. 1. The fourth transistor T4 may be an n-MOSFET, and may be disposed at the position of the second transistor T2 of FIG. 1. The configuration of the third transistor T3 may be the same as the second transistor T2 of FIG. 1. The configuration of the fourth transistor T4 may be the same as the first transistor T1 of FIG. 1. The second substrate 28 may exist on both sides of the fourth transistor T4. The CMOS of FIG. 2 may be identical to the CMOS of FIG. 1 having the first and second transistors T1 and T2 whose positions are switched.

Figure 3:
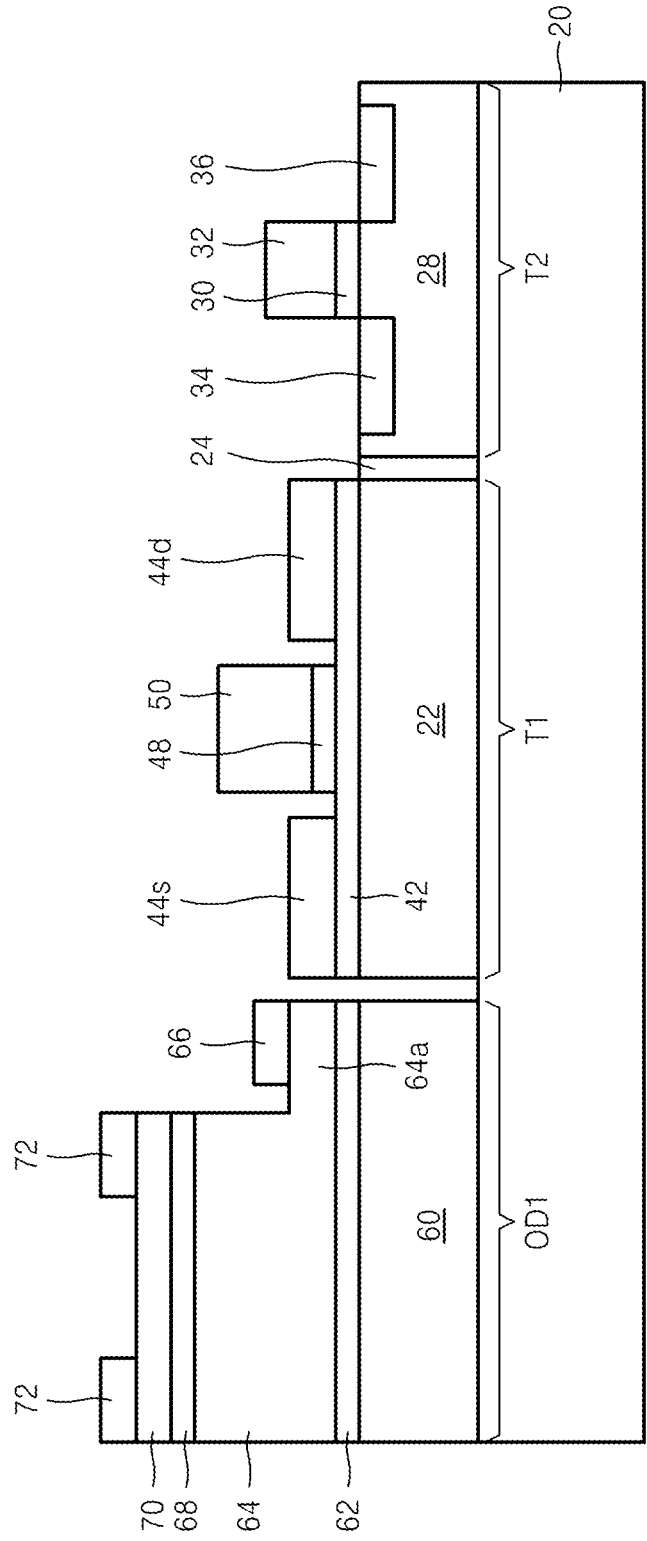
FIG. 3 is a cross-sectional view of an optical apparatus including a CMOS device according to example embodiments.

FIG. 3 is a view illustrating when a CMOS device according to example embodiments and an optical device including a Group III-V material are provided together.

Referring to FIG. 3, the first and second transistors T1 and T2 and a first optical device OD1 may be formed on the silicon substrate 20. The second transistor T2 may be disposed at one side of the first transistor T1, for example, the right side. The first optical device OD1 may be disposed at the other side of the first transistor T1, for example, the left side. The first optical device OD1, as a light emitting device, may be a light emitting diode (LED) or a laser diode (LD). The first optical device OD1, as a light receiving device, may be a photo diode. The first optical device OD1 is adjacent to the first transistor T1, but does not contact the first transistor T1. In such a configuration, the CMOS including the first and second transistors T1 and T2 may relate to a light emitting or light receiving operation of the first optical device OD1.

In the first optical device OD1, a buffer layer 62 may exist on a third substrate 60. The third substrate 60 may be formed of the same material as the first substrate 22 of the first transistor T1. A first compound semiconductor layer 64 may be formed on the buffer layer 62. The first compound semiconductor layer 64 may be an epitaxially-grown layer. The first compound semiconductor layer 64 has a first portion 64a extending in a lateral direction. In the first compound semiconductor layer 64, the remaining portion except for the first portion 64a may be thicker than the first portion 64a, and the top surface of the remaining portion is higher than that of the first portion 64a. The first compound semiconductor layer 64 may be an n-type compound semiconductor layer.

A first electrode 66 exists on the first portion 64a of the first compound semiconductor layer 64. The first electrode 66 may be an n-type electrode. An active layer 68 and a second compound semiconductor layer 70 are sequentially stacked on the first compound semiconductor layer 64. The active layer 68 may be an area where light is generated when a p-type carrier and an n-type carrier are recombined, or an area where an n-type carrier and a p-type carrier are generated by incident light.

The active layer 68 may further include a cladding layer covering top and bottom surfaces of the active layer 68 on the top and bottom surfaces thereof. The second compound semiconductor layer 70 may be of the opposite type to the first compound semiconductor layer 64. For example, the second compound semiconductor layer 70 may be a p-type compound semiconductor layer. Spaced second electrodes 72 may exist on the second compound semiconductor layer 70. The second electrode 72 has an opposite polarity to the first electrode 66. For example, the second electrode 72 may be a p-type electrode.

Figure 4:
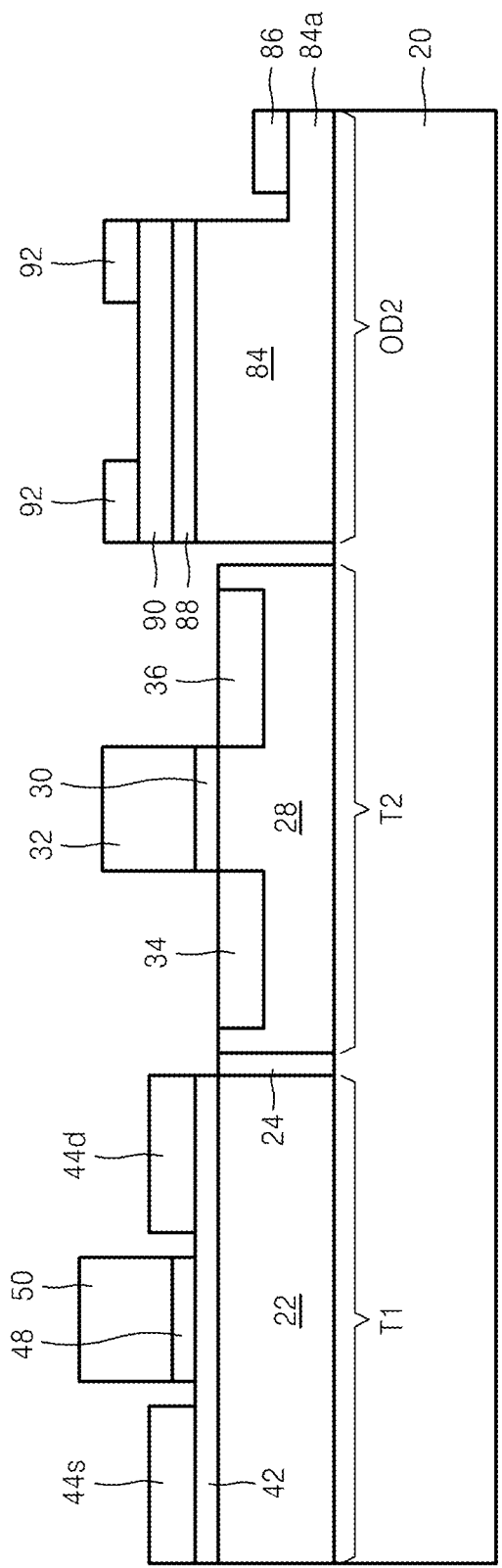
FIG. 4 is a cross-sectional view of an optical apparatus including a CMOS device according to example embodiments.

FIG. 4 is a view illustrating when a CMOS according to example embodiments and a germanium based optical device are provided together. Referring to FIG. 4, the first and second transistors T1 and T2 and a second optical device OD2 may be formed on the silicon substrate 20. As shown in FIG. 3, the first and second transistors T1 and T2 may constitute a CMOS related to an operation of the second optical device OD2. The first transistor T1 may be disposed at one side of the second transistor T2, for example, the left side. The first transistor T1 faces the second transistor T2, with the insulating layer 24 therebetween. The second optical device OD2 may be disposed at the other side of the second transistor T2, for example, the right side. The second optical device OD2 is adjacent to the second transistor T2, but does not contact the second transistor T2. The second optical device OD2 may be a light receiving device, e.g., a photo diode, or may be a light emitting device, e.g., an LD. The second optical device OD2 includes a first semiconductor layer 84 on the silicon substrate 20. The first semiconductor layer 84 has a first portion 84a extending in a lateral direction.

A third electrode 86 exists on the first portion 84a. The first semiconductor layer 84 may be a germanium layer or a compound semiconductor layer including germanium. The first semiconductor layer 84 may be an epitaxially-grown layer. The third electrode 86 may be an n-type electrode. In the first semiconductor layer 84, the remaining portion except the first portion 84a, e.g., a main body, is thicker than the first portion 84a and the top surface of the remaining portion is higher than that of the first portion 84a.

An active layer 88 and a second semiconductor layer 90 may be sequentially stacked on the first semiconductor layer 84. The active layer 88 may be formed of the same material as the active layer 68 of the first optical device OD1 of FIG. 3. The second semiconductor layer 90 may be of the opposite type to the first semiconductor layer 84. For example, when the first semiconductor layer 84 is an n-type, the second semiconductor layer 90 may be a p-type. The second semiconductor layer 90 may be a single semiconductor layer, or a compound semiconductor layer. A fourth electrode 92 exists on the second semiconductor layer 90. The fourth electrode 92 has an opposite polarity to the third electrode 86. The fourth electrode 92 may be a p-type electrode.

A method of manufacturing a CMOS device according to example embodiments will be described with reference to FIGS. 5 to 15. In this description, like reference numbers refer to like elements and any overlapping descriptions will be omitted.

Figure 5:
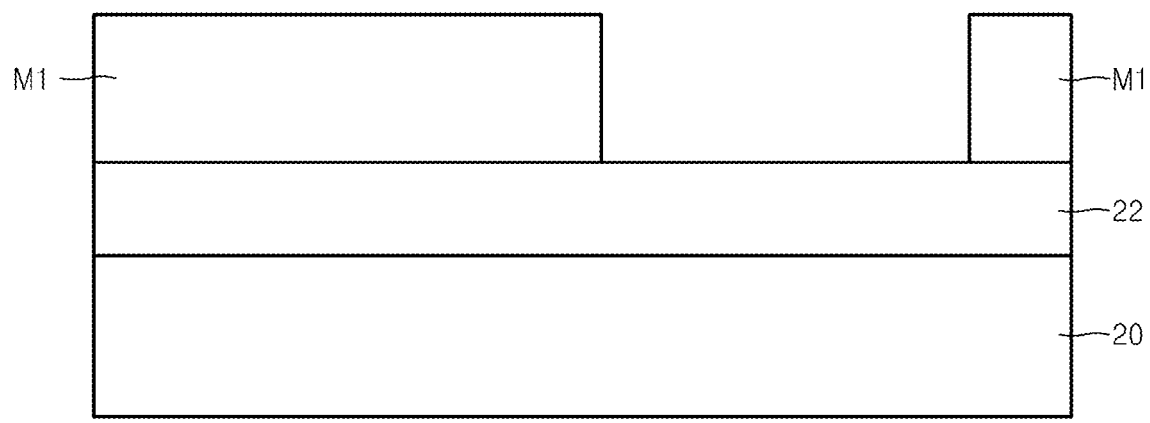
FIGS. 5 to 15 are cross-sectional views illustrating a method of manufacturing a CMOS device according to example embodiments.

Referring to FIG. 5, the first substrate 22 may be formed on the silicon substrate 20. The first substrate 22 may be formed by using an epitaxy method and a metal-organic chemical vapor deposition (MOCVD) device may be used for the epitaxy method. The first substrate 22 may be formed by growing a binary Group III-V material, e.g., GaAs or GaP, to a thickness of several nm to tens of nm at a relatively low temperature (for example, about 400° C.), increasing a temperature of MOCVD reaction and continuing to grow the binary Group III-V material to a predetermined or given thickness at a higher temperature than the low temperature, for example, about 600° C.

Moreover, a buffer layer may be formed on the silicon substrate 20, and the first substrate 22 may be grown on the buffer layer. The buffer layer may be an InAlAs layer. For convenience, the buffer layer is not shown in FIG. 5.

Wet treatment and in-situ annealing may be performed as a pre-treatment for the first substrate 22. A first mask M1 exposing a portion of the first substrate 22 may be formed on the first substrate 22. The first mask M1 may have a photosensitive film pattern. After the first mask M1 is formed, the exposed portion of the first substrate may be etched. At this point, the etching process may be performed until the silicon substrate 20 is exposed. Such an etching process may be a dry etching process. After a dry etching process, a wet etching process may be performed if necessary. After the etching, the first mask M1 may be removed. A portion of the silicon substrate 20 may be exposed by the etching as shown in FIG. 6.

Figure 6:
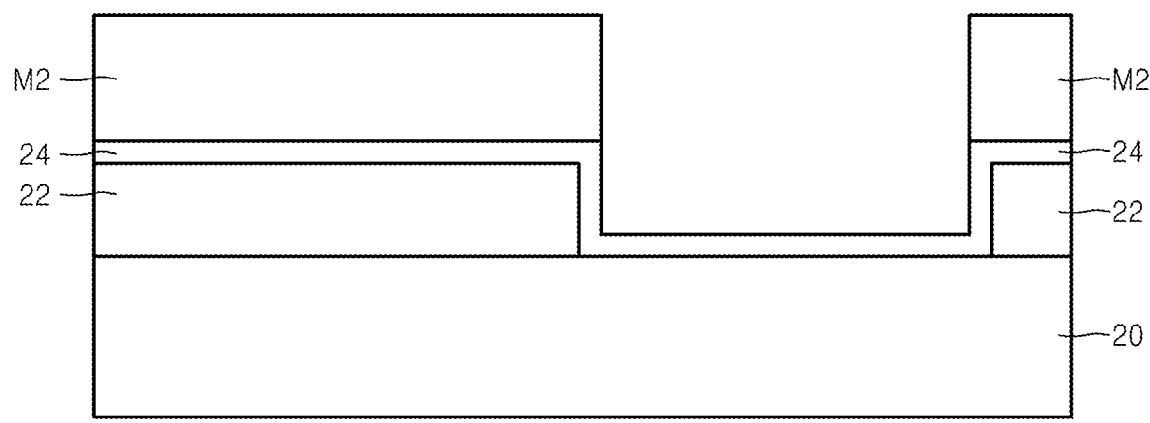

Referring to FIG. 6, an insulating layer 24 covering the exposed portion of the silicon substrate 20 may be formed on the first substrate 22. The insulating layer 24 may be formed with an oxide layer, a nitride layer, or an oxide nitride layer. For example, the insulating layer 24 may be formed with a silicon oxide ($SiO_2$) layer, a silicon nitride ($SiN_x$) layer, or a silicon oxide nitride ($SiO_xN_y$) layer. A second mask M2 may be formed only on the insulating layer 24 that is formed on the top surface of the first substrate 22. Accordingly, the portion of the insulating layer 24 covering the exposed portion of the silicon substrate 20 may be exposed. The second mask M2 may have a photosensitive film pattern. After the second mask M2 is formed, the exposed portion of the insulating layer 24 may be etched. The etching process may be performed until the silicon substrate 20 is exposed. The second mask M2 may be removed.

Figure 7:
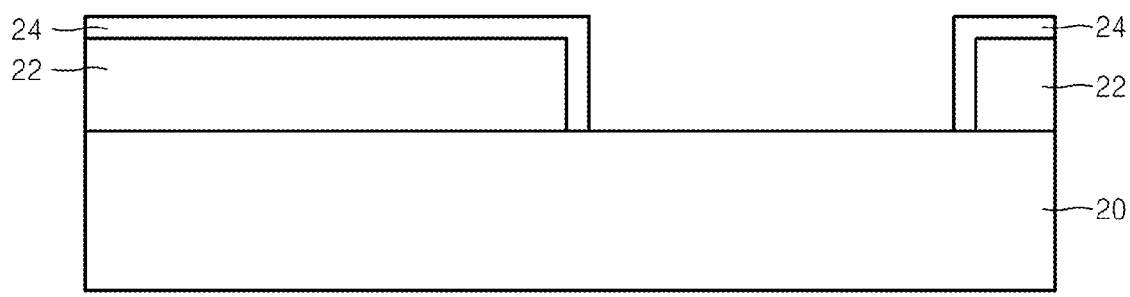

Referring to FIG. 7, the insulating layer 24 on the exposed portion of the silicon substrate 20 may be removed through the etching process of FIG. 6. After the etching, the insulating layer 24 may remain only on the top surface and exposed lateral surface of the first substrate 22. The remaining portion of the insulating layer 24 may be used as a mask during a subsequent selective growth process.

Figure 8:
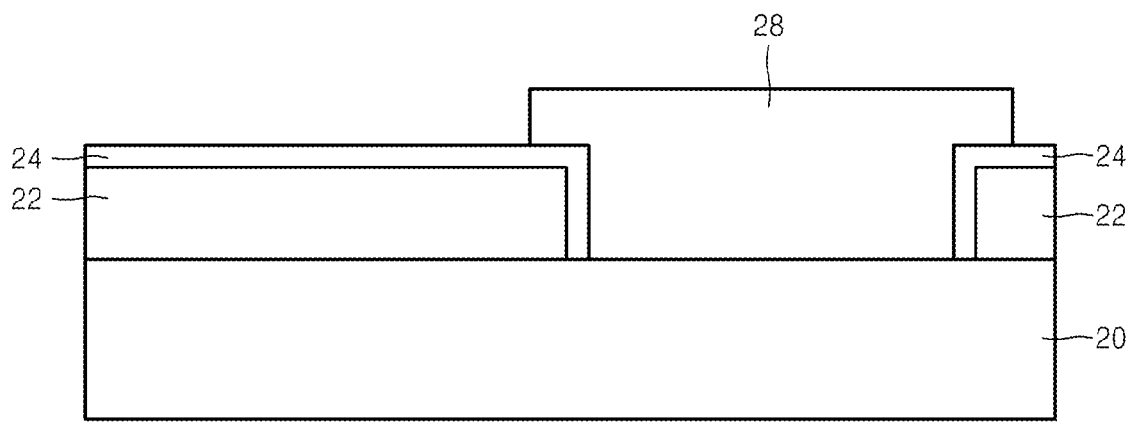

Referring to FIG. 8, the second substrate 28 may be formed on the exposed portion of the silicon substrate 20. The second substrate 28 may be formed through an epitaxy method. For example, the second substrate 28 may be formed by growing Ge to a thickness of several nm to tens of nm at a relatively low temperature (for example, about 400° C.) and then growing Ge at a higher temperature than the low temperature, for example, about 600° C. At this point, the insulating layer 24 may be used as a mask. The surfaces of the first substrate 22, e.g., the top surface and lateral surface, are covered with the insulating layer 24, and accordingly, the second substrate 28 may selectively grow only on the exposed area of the silicon substrate 20.

During a growth process of the second substrate 28, a portion of the second substrate 28 may be formed on the insulating layer 24 that is formed on the top surface of the first substrate 22. After the second substrate 28 is formed in such a manner, the surface of the second substrate 28 may be planarized. Such a planarization process may be performed until the insulating layer 24 is exposed. The planarization process may be performed through a chemical mechanical polishing (CMP) method.

Figure 9:
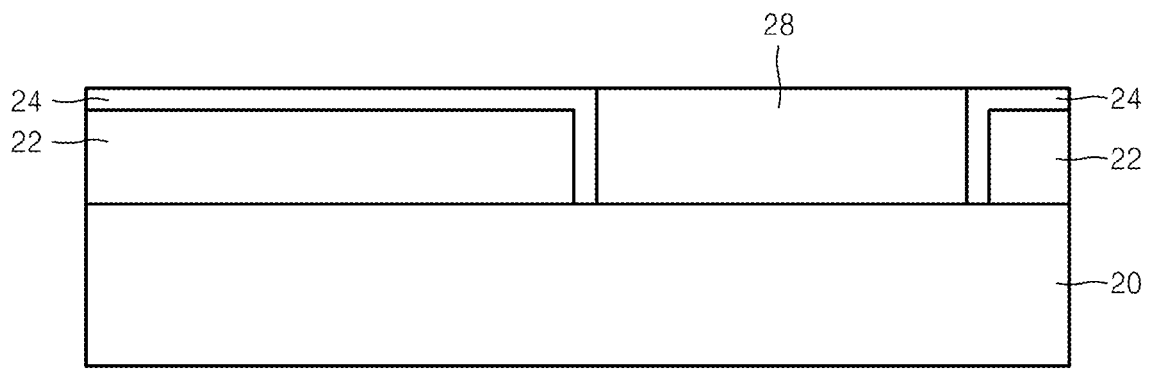

FIG. 9 is a cross-sectional view illustrating when the planarization is completed. Referring to FIG. 9, after the planarization, the top surface of the second substrate 28 may have the same height as that of the insulating layer 24. However, in consideration that the thickness of the insulating layer 24 is thinner than that of each of the first and second substrates 22 and 28, the height of the top surface of the second substrate 28 after the planarization may be identical to that of the first substrate 22.

Figure 10:
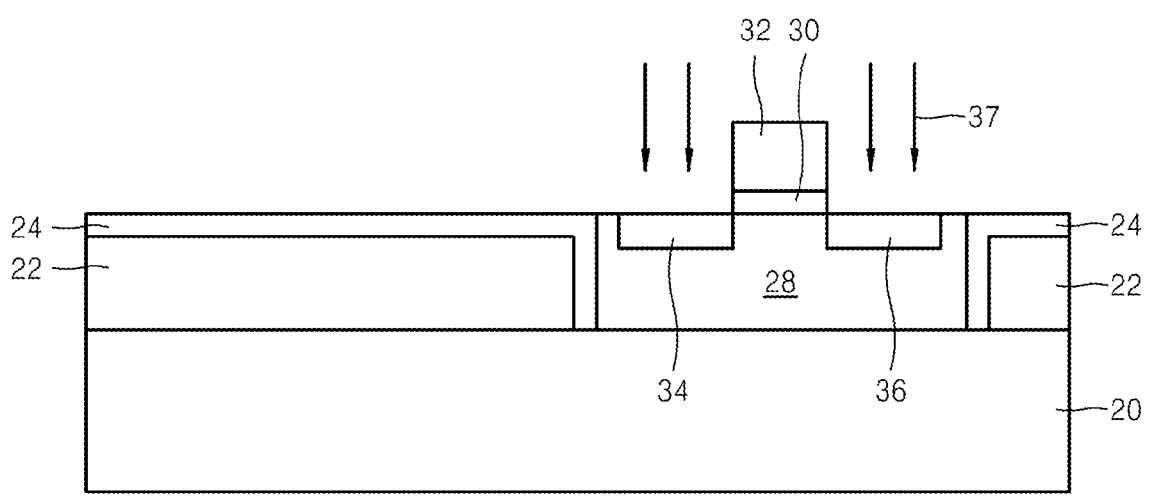

Referring to FIG. 10, a second transistor, e.g., a p-MOSFET, may be formed on the second substrate 28. In more detail, a gate stacked structure including the insulating layer 30 and the gate electrode 32 may be formed on a predetermined or given area of the second substrate 28. The gate stacked structure including the insulating layer 30 and the gate electrode 32 may be formed by sequentially stacking an insulating layer 30 and a gate electrode 32. After the gate stacked structure is formed, a conductive impurity 37 may be ion-implanted on the second substrate 28 at both sides of the gate stacked structure. By doing so, spaced first and second impurity areas 34 and 36 are formed to the second substrate 28, with the gate stacked structure therebetween. The conductive impurity 37 may be a p-type impurity. Thus, the second transistor (T2 of FIG. 1), e.g., the p-MOSFET, is formed on the second substrate 28.

Figure 11:
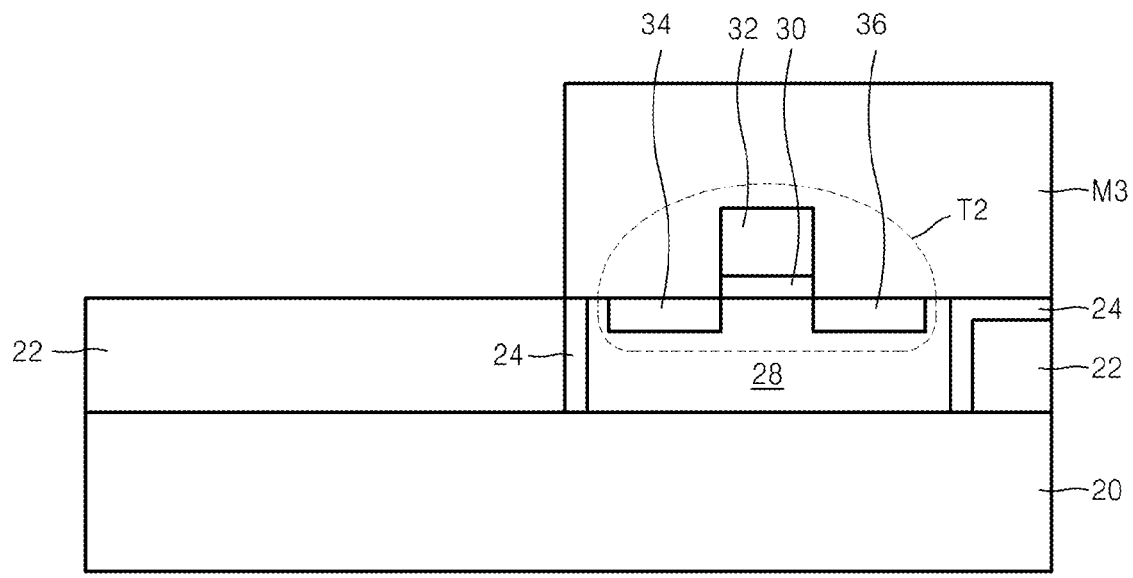

As shown in FIG. 11, a third mask M3 covering the second transistor T2 may be formed. The third mask M3 may have a photosensitive film pattern. After the third mask M3 is formed, the insulating layer 24 may be removed from the top surface of the first substrate 22. The third mask M3 is removed.

Figure 12:
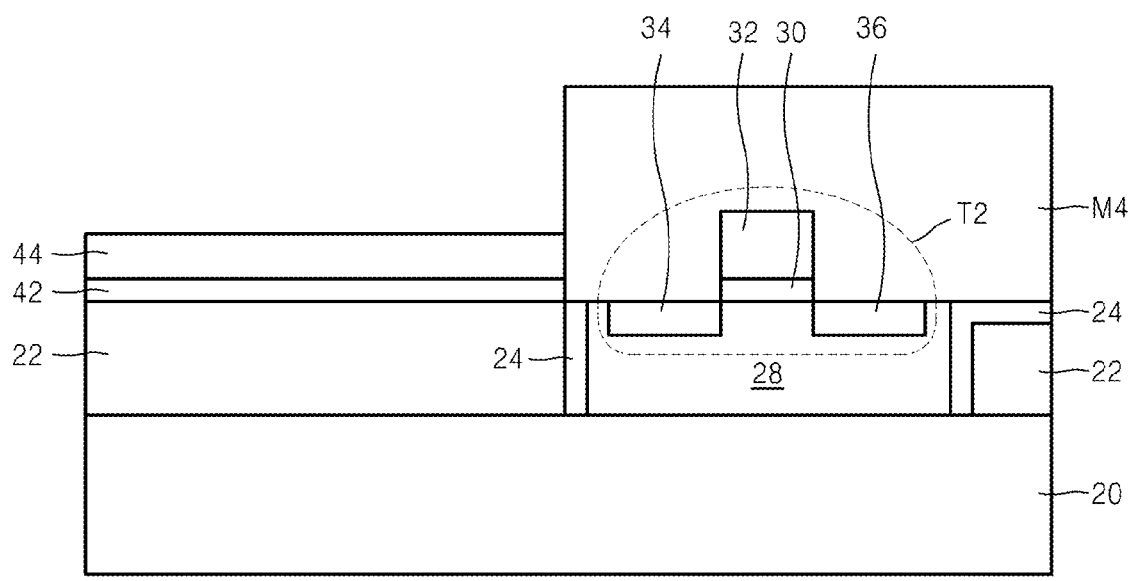

Referring to FIG. 12, after a fourth mask M4 covering the second transistor T2 is formed, a channel layer 42 and an electrode layer 44 are sequentially stacked on the top surface of the first substrate 22. At this point, the channel layer 42 and the electrode layer 44 may also be stacked on the fourth mask M4. The channel layer 42 may be formed of InGaAs, InAs, InSb, or InGaSb. The electrode layer 44 may be formed of a conductive material which may be used as material for a source or drain electrode. After the electrode layer 44 is formed, the fourth mask M4 is removed. At this point, both the channel layer and the electrode layer on the fourth mask M4 may be removed.

Figure 13:
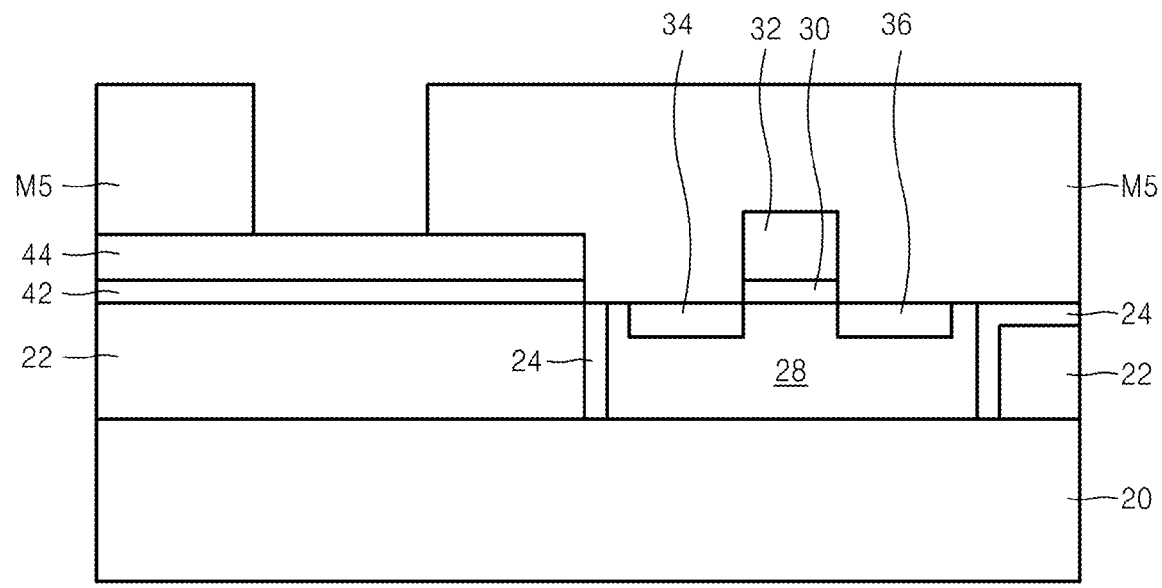

Referring to FIG. 13, a fifth mask M5 covering the second transistor T2 formed on the second substrate 28 and a portion of the electrode layer 44 is formed. The fifth mask M5 is formed to expose a portion of the electrode layer 44. The exposed portion of the electrode layer 44 corresponds to a position where a gate electrode is formed during a subsequent process. The fifth mask M5 may have a photosensitive film pattern.

Figure 14:
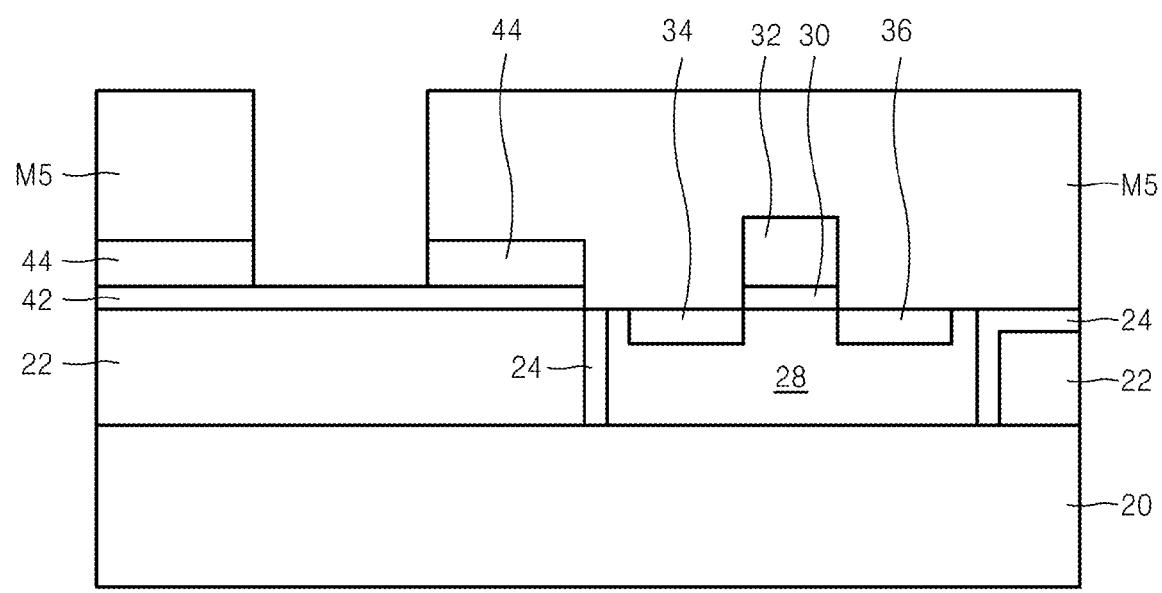

After the fifth mask M5 is formed, as shown in FIG. 14, the exposed portion of the electrode layer 44 is removed to expose the channel layer 42. Because the exposed portion of the electrode layer 44 is removed, the electrode layer 44 is separated into two parts. The separated two parts of the electrode layer 44 are used as the first and second electrodes 44s and 44d of FIG. 1.

Figure 15:
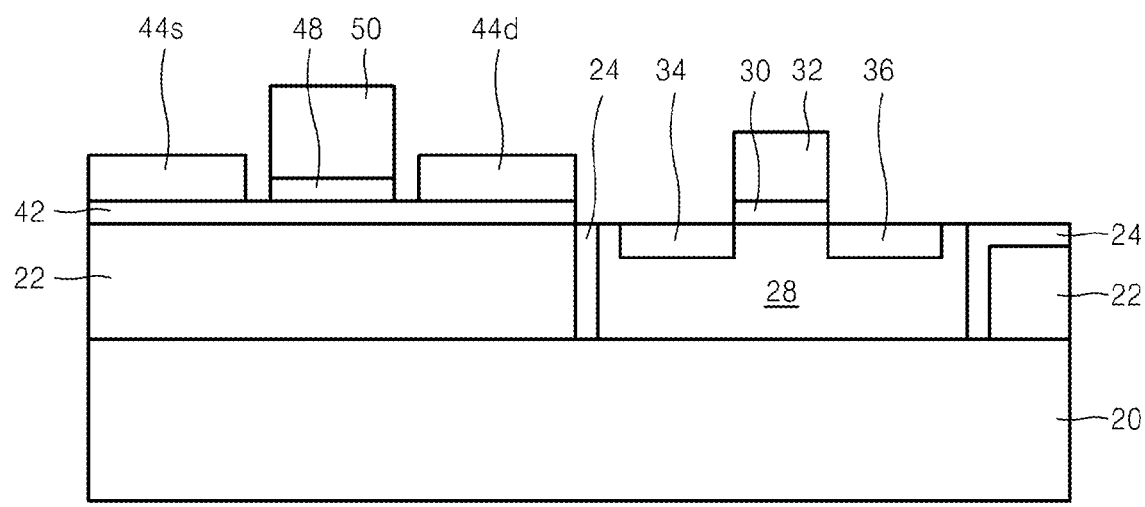

Referring to FIG. 15, a gate stacked structure including a gate insulating layer 48 and a gate electrode 50 may be formed on the channel layer 42 between the first and second electrodes 44s and 44d. The gate stacked structure may be formed by sequentially stacking the gate insulating layer 48 and the gate electrode 50. The gate stacked structure including the gate insulating layer 48 and the gate electrode 50 may be formed when there is the fifth mask M5, or may be formed by using a new mask after the fifth mask M5 is removed. In such a manner, an n-MOSFET is formed to the second substrate 22.

Moreover, referring to FIG. 5, instead of the first substrate 22, the second substrate may be formed, and referring to FIG. 8, instead of the second substrate 28, the first substrate 22 may be formed. In such a case, the CMOS device of FIG. 2 is formed.

Figure 16:
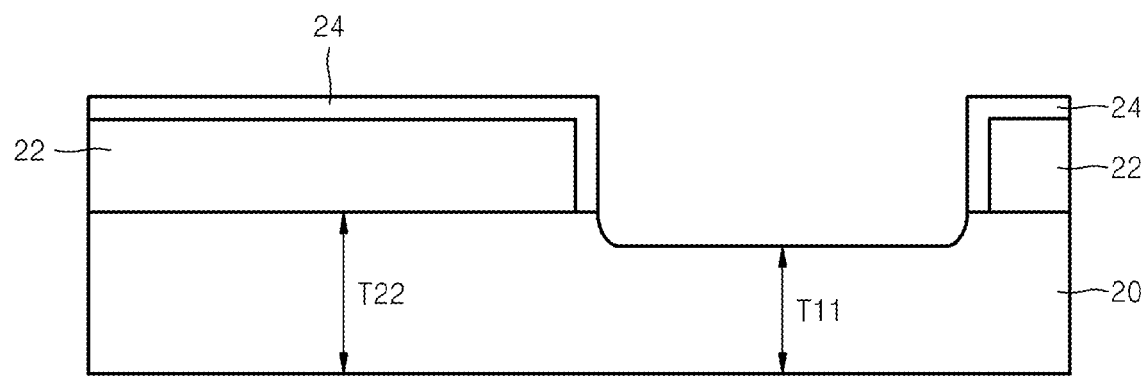
FIG. 16 is a cross-sectional view illustrating when an exposed area of a silicon substrate of FIG. 7 is partially etched.

Additionally, after the silicon substrate 20 is exposed in FIG. 7, an etching process on the exposed portion of the silicon substrate 20 may be additionally performed. At this point, the additional etching process may use wet etching. Accordingly, the thickness T11 of the exposed portion of the silicon substrate 20 may be thinner than that T22 of the unexposed portion of the silicon substrate 20, as shown in FIG. 16. Also, because wet etching is used, the boundary of a bottom corner of the etched portion of the silicon substrate 20 may have a curved shape. Accordingly, when a material grows on the exposed portion of the silicon substrate 20, less defects may occur. While in the state shown in FIG. 16, the process of FIG. 8 and its subsequent processes may be performed.

Figure 17:
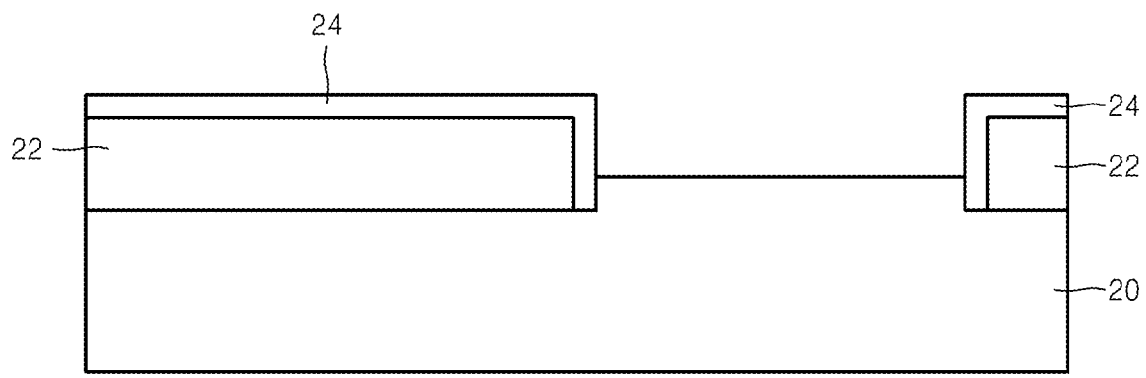
FIG. 17 is a cross-sectional view illustrating when an exposed area of a silicon substrate of FIG. 7 grows by a predetermined or given thickness.

On the other hand, as shown in FIG. 17, after a process for growing the exposed portion of the silicon substrate 16 by a predetermined or given thickness is performed to allow the exposed portion of the silicon substrate 16 to be thicker than any other portions, the process of FIG. 8 and its subsequent processes may be performed.

Figure 18:
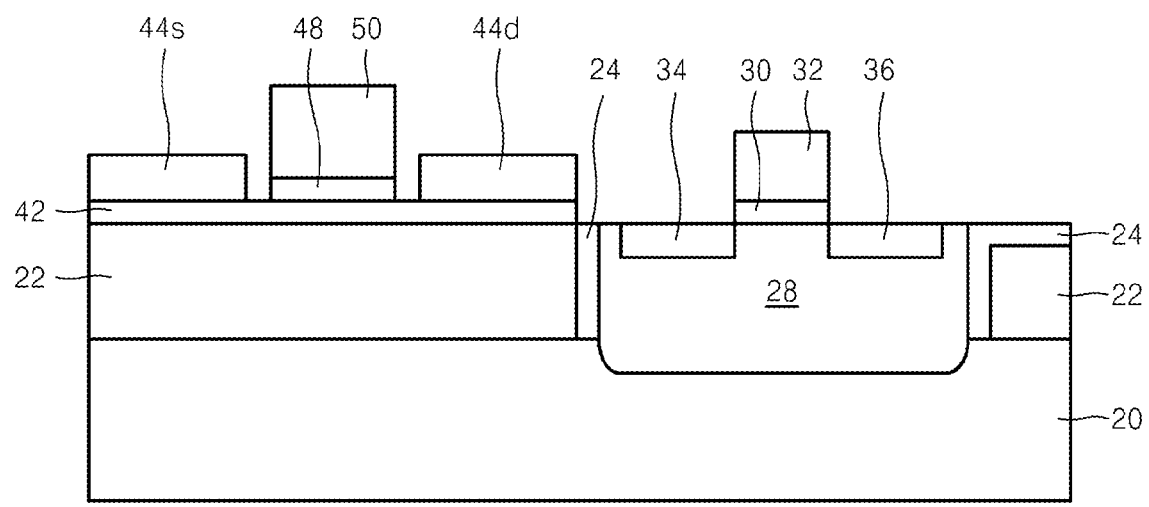
FIG. 18 is a cross-sectional view of a CMOS device formed using a silicon substrate of FIG. 16.
Figure 19:
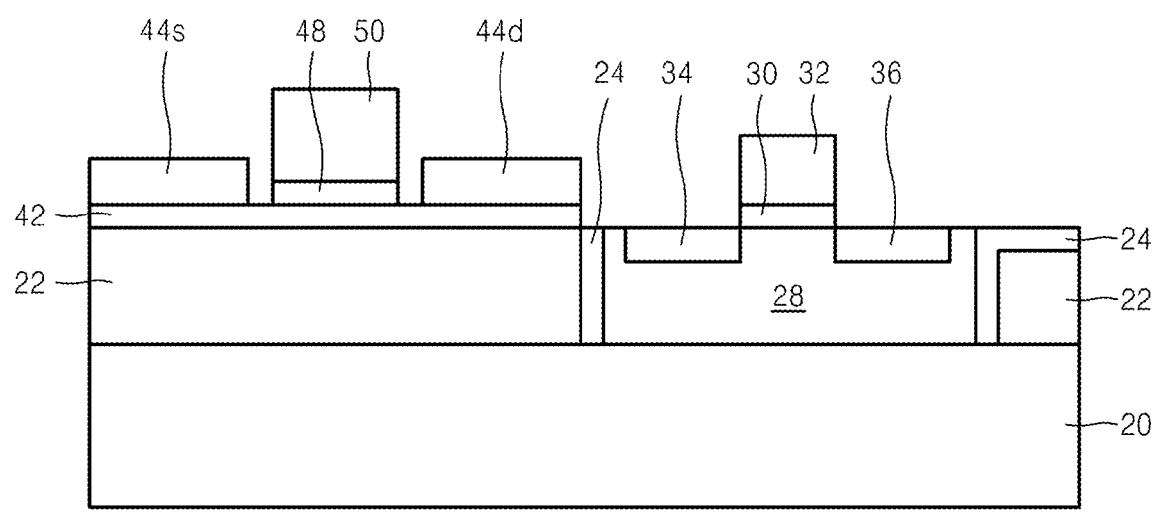
FIG. 19 is a cross-sectional view of a CMOS device formed using a silicon substrate of FIG. 17.

FIG. 18 shows a CMOS device formed by applying the process of FIG. 8 and its subsequent processes to FIG. 16. FIG. 19 shows a CMOS device formed by applying the process of FIG. 8 and its subsequent processes to FIG. 17.

According to example embodiments, a device is formed by integrally forming a device using a Group III-V substrate and a device using a germanium based substrate on a silicon substrate. Therefore, device performance may be maximized or increased, and because manufacturing processes using a general silicon substrate are used, manufacturing costs may be reduced.

Additionally, because the germanium based substrate is formed through a selective area growth (SAG) method, less defects may occur.

It should be understood that example embodiments described herein should be considered in a descriptive sense only and not for purposes of limitation. Descriptions of features or aspects within each embodiment should typically be considered as available for other similar features or aspects in other example embodiments.

What is claimed is:

1. A complementary metal oxide semiconductor (CMOS) device comprising:
a n-type first transistor on a silicon substrate, the n-type first transistor including a first substrate, the first substrate including a Group III-V compound semiconductor; and
a p-type second transistor on the silicon substrate, the p-type second transistor including a second substrate, the second substrate including germanium,
wherein at least one of the first substrate and the second substrate is in direct contact with the silicon substrate, and
wherein a configuration of the first n-type transistor is different from a configuration of the second p-type transistor.

2. The CMOS device of claim 1, wherein the n-type first transistor comprises:
a channel layer on the first substrate;
a source electrode on the channel layer;
a drain electrode on the channel layer and spaced apart from the source electrode; and
a gate stacked structure on the channel layer between the source electrode and the drain electrode.

3. The CMOS device of claim 1, wherein the p-type second transistor comprises:
a first impurity area in the second substrate;
a second impurity area in the second substrate and spaced apart from the first impurity area; and
a gate stacked structure on the second substrate between the first impurity area and the second impurity area.

4. The CMOS device of claim 1, wherein the first substrate is one of a binary compound semiconductor substrate and a multicomponent compound semiconductor substrate including at least one of arsenic (As), phosphorus (P), and antimony (Sb).

5. The CMOS device of claim 1, wherein the second substrate is one of a germanium (Ge) substrate and a silicon-germanium (SiGe) substrate.

6. The CMOS device of claim 1, wherein one of the first and second substrates is surrounded by the other one of the first and second substrates.

7. An optical apparatus comprising:
a CMOS device on a silicon substrate, the CMOS device including,
a n-type first transistor including a first substrate, the first substrate including a Group III-V compound semiconductor, and
a p-type second transistor including a second substrate, the second substrate including germanium; and
an optical device on the silicon substrate separate from the CMOS device.

8. The optical apparatus of claim 7, wherein the optical device is one of a light emitting diode (LED) and a laser diode (LD), and includes a Group III-V compound semiconductor.

9. The optical apparatus of claim 7, wherein the optical device is a light receiving device, and includes a germanium (Ge) based semiconductor layer.

10. The optical apparatus of claim 7, wherein one of the first and second substrates is surrounded by the other one of the first and second substrates.

* * * * *